United States Patent
Huang et al.

(10) Patent No.: US 8,399,305 B2
(45) Date of Patent: Mar. 19, 2013

(54) SEMICONDUCTOR DEVICE AND METHOD OF FORMING DAM MATERIAL WITH OPENINGS AROUND SEMICONDUCTOR DIE FOR MOLD UNDERFILL USING DISPENSER AND VACUUM ASSIST

(75) Inventors: Rui Huang, Singapore (SG); Seng Guan Chow, Singapore (SG); Heap Hoe Kuang, Singapore (SG)

(73) Assignee: STATS ChipPac, Ltd., Singapore (SG)

( * ) Notice: Subject to any disclaimer, the term of this patent is extended or adjusted under 35 U.S.C. 154(b) by 320 days.

(21) Appl. No.: 12/885,831

(22) Filed: Sep. 20, 2010

(65) Prior Publication Data
US 2012/0068353 A1 Mar. 22, 2012

(51) Int. Cl.
H01L 21/00 (2006.01)
H01L 23/48 (2006.01)

(52) U.S. Cl. .................. 438/127; 257/787; 257/E23.129

(58) Field of Classification Search .................. 438/127; 257/767, 787, E23.129
See application file for complete search history.

(56) References Cited

U.S. PATENT DOCUMENTS

| | | | | |
|---|---|---|---|---|
| 5,120,678 A * | 6/1992 | Moore et al. | | 29/840 |
| 5,203,076 A * | 4/1993 | Banerji et al. | | 29/840 |
| 5,293,072 A * | 3/1994 | Tsuji et al. | | 257/737 |
| 5,659,203 A * | 8/1997 | Call et al. | | 257/778 |
| 5,942,798 A * | 8/1999 | Chiu | | 257/737 |
| 6,048,656 A * | 4/2000 | Akram et al. | | 438/118 |
| 6,071,761 A * | 6/2000 | Jacobs | | 438/127 |
| 6,228,688 B1 * | 5/2001 | Ohta et al. | | 438/127 |
| 6,355,198 B1 * | 3/2002 | Kim et al. | | 264/259 |
| 6,373,142 B1 * | 4/2002 | Hoang | | 257/783 |
| 6,391,682 B1 * | 5/2002 | Tsai et al. | | 438/108 |
| 6,413,801 B1 * | 7/2002 | Lin | | 438/127 |
| 6,459,164 B2 * | 10/2002 | Nagerl et al. | | 257/795 |
| 6,534,345 B1 * | 3/2003 | Muff et al. | | 438/127 |
| 6,614,122 B1 | 9/2003 | Dory et al. | | |
| 6,645,793 B2 * | 11/2003 | Fujii et al. | | 438/127 |
| 6,895,666 B2 | 5/2005 | Hong et al. | | |
| 7,256,066 B2 | 8/2007 | Chen et al. | | |
| 2011/0147912 A1 * | 6/2011 | Karpur et al. | | 257/687 |
| 2012/0068353 A1 * | 3/2012 | Huang et al. | | 257/774 |
| 2012/0187583 A1 * | 7/2012 | Karpur et al. | | 257/787 |

* cited by examiner

*Primary Examiner* — Lex Malsawma
(74) *Attorney, Agent, or Firm* — Robert D. Atkins; Patent Law Group: Atkins & Associates, P.C.

(57) ABSTRACT

A semiconductor wafer contains a plurality of semiconductor die separated by saw streets. A dam material is formed over the saw streets around each of the semiconductor die. A plurality of openings is formed in the dam material. The openings in the dam material can be formed on each side or corners of the first semiconductor die. The semiconductor wafer is singulated through the dam material to separate the semiconductor die. The semiconductor die is mounted to a substrate. A mold underfill is deposited through a first opening in the dam material. A vacuum is drawn on a second opening in the dam material to cause the underfill material to cover an area between the first semiconductor die and substrate without voids. The number of second openings can be greater than the number of first openings. The first opening can be larger than the second opening.

28 Claims, 11 Drawing Sheets

US 8,399,305 B2

SEMICONDUCTOR DEVICE AND METHOD OF FORMING DAM MATERIAL WITH OPENINGS AROUND SEMICONDUCTOR DIE FOR MOLD UNDERFILL USING DISPENSER AND VACUUM ASSIST

FIELD OF THE INVENTION

The present invention relates in general to semiconductor devices and, more particularly, to a semiconductor device and method of forming a dam material with a plurality of openings around a semiconductor die for mold underfill using dispenser and vacuum assist.

BACKGROUND OF THE INVENTION

Semiconductor devices are commonly found in modern electronic products. Semiconductor devices vary in the number and density of electrical components. Discrete semiconductor devices generally contain one type of electrical component, e.g., light emitting diode (LED), small signal transistor, resistor, capacitor, inductor, and power metal oxide semiconductor field effect transistor (MOSFET). Integrated semiconductor devices typically contain hundreds to millions of electrical components. Examples of integrated semiconductor devices include microcontrollers, microprocessors, charged-coupled devices (CCDs), solar cells, and digital micro-mirror devices (DMDs).

Semiconductor devices perform a wide range of functions such as signal processing, high-speed calculations, transmitting and receiving electromagnetic signals, controlling electronic devices, transforming sunlight to electricity, and creating visual projections for television displays. Semiconductor devices are found in the fields of entertainment, communications, power conversion, networks, computers, and consumer products. Semiconductor devices are also found in military applications, aviation, automotive, industrial controllers, and office equipment.

Semiconductor devices exploit the electrical properties of semiconductor materials. The atomic structure of semiconductor material allows its electrical conductivity to be manipulated by the application of an electric field or base current or through the process of doping. Doping introduces impurities into the semiconductor material to manipulate and control the conductivity of the semiconductor device.

A semiconductor device contains active and passive electrical structures. Active structures, including bipolar and field effect transistors, control the flow of electrical current. By varying levels of doping and application of an electric field or base current, the transistor either promotes or restricts the flow of electrical current. Passive structures, including resistors, capacitors, and inductors, create a relationship between voltage and current necessary to perform a variety of electrical functions. The passive and active structures are electrically connected to form circuits, which enable the semiconductor device to perform high-speed calculations and other useful functions.

Semiconductor devices are generally manufactured using two complex manufacturing processes, i.e., front-end manufacturing, and back-end manufacturing, each involving potentially hundreds of steps. Front-end manufacturing involves the formation of a plurality of die on the surface of a semiconductor wafer. Each die is typically identical and contains circuits formed by electrically connecting active and passive components. Back-end manufacturing involves singulating individual die from the finished wafer and packaging the die to provide structural support and environmental isolation.

One goal of semiconductor manufacturing is to produce smaller semiconductor devices. Smaller devices typically consume less power, have higher performance, and can be produced more efficiently. In addition, smaller semiconductor devices have a smaller footprint, which is desirable for smaller end products. A smaller die size may be achieved by improvements in the front-end process resulting in die with smaller, higher density active and passive components. Back-end processes may result in semiconductor device packages with a smaller footprint by improvements in electrical interconnection and packaging materials.

With increasing functionality and input/output (I/O) count, semiconductor devices continue to increase in die size. In some microprocessor applications, the die size can exceed 260 millimeters (mm) square with more than 1000 I/O count. The large die size increases the difficulty factor in encapsulating the die without forming voids. In addition, the high I/O count and corresponding fine interconnect pitch reduces the gap between the semiconductor die and mounting substrate. Given the encapsulant viscosity, the narrower gap reduces the encapsulant flow rate and increases the time required for encapsulation, as well as manufacturing costs.

SUMMARY OF THE INVENTION

A need exists to efficiently deposit mold underfill between a large semiconductor die and substrate without forming voids. Accordingly, in one embodiment, the present invention is a method of making a semiconductor device comprising the steps of providing a semiconductor wafer containing a plurality of first semiconductor die separated by saw streets, forming a dam material over the saw streets around each of the first semiconductor die, forming a plurality of openings in the dam material, singulating the semiconductor wafer along the saw streets through the dam material to separate the first semiconductor die, mounting the first semiconductor die to a substrate, depositing a mold underfill through a first opening in the dam material, and drawing a vacuum on a second opening in the dam material to cause the underfill material to cover an area between the first semiconductor die and substrate.

In another embodiment, the present invention is a method of making a semiconductor device comprising the steps of providing a semiconductor wafer containing a plurality of semiconductor die, forming a dam material around each of the semiconductor die, forming a plurality of openings in the dam material, singulating the semiconductor wafer to separate the semiconductor die, mounting the semiconductor die to a substrate, depositing a mold underfill through a first opening in the dam material, and drawing a vacuum on a second opening in the dam material to spread the underfill material over an area between the semiconductor die and substrate.

In another embodiment, the present invention is a method of making a semiconductor device comprising the steps of providing a semiconductor die, forming a dam material around the semiconductor die, forming a plurality of openings in the dam material, mounting the semiconductor die to a substrate, depositing a mold underfill through a first opening in the dam material, and drawing a vacuum on a second opening in the dam material to spread the underfill material over an area between the semiconductor die and substrate.

In another embodiment, the present invention is a semiconductor device comprising a substrate and semiconductor die mounted to the substrate. A dam material is formed around the semiconductor die. A plurality of openings is formed in the dam material. A dispenser is in fluid communication with a first opening in the dam material for depositing a mold underfill through the first opening. A vacuum is in fluid communication with a second opening in the dam material for drawing the underfill material over an area between the semiconductor die and substrate.

DETAILED DESCRIPTION OF THE DRAWINGS

Figure 1:
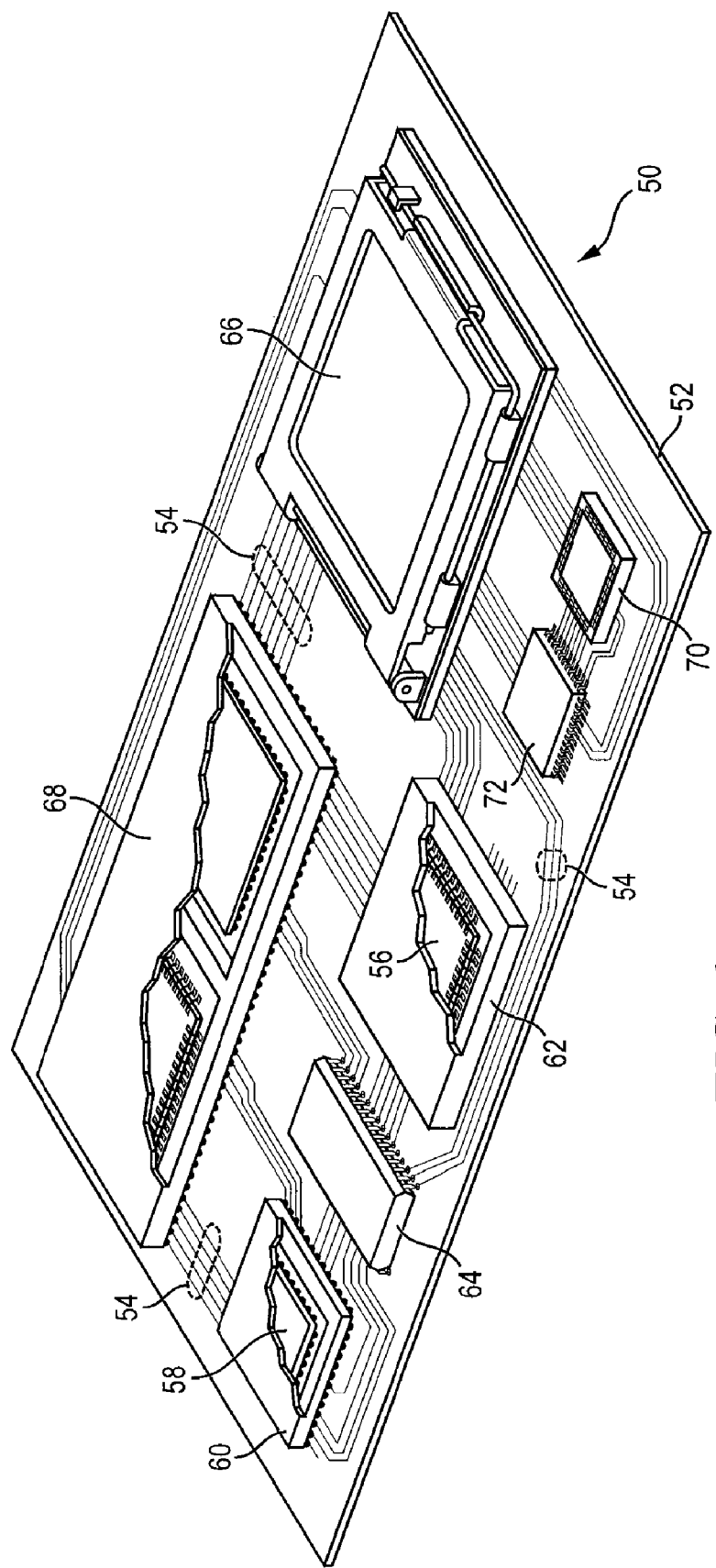
FIG. 1 illustrates a PCB with different types of packages mounted to its surface.

The present invention is described in one or more embodiments in the following description with reference to the figures, in which like numerals represent the same or similar elements. While the invention is described in terms of the best mode for achieving the invention's objectives, it will be appreciated by those skilled in the art that it is intended to cover alternatives, modifications, and equivalents as may be included within the spirit and scope of the invention as defined by the appended claims and their equivalents as supported by the following disclosure and drawings.

Semiconductor devices are generally manufactured using two complex manufacturing processes: front-end manufacturing and back-end manufacturing. Front-end manufacturing involves the formation of a plurality of die on the surface of a semiconductor wafer. Each die on the wafer contains active and passive electrical components, which are electrically connected to form functional electrical circuits. Active electrical components, such as transistors and diodes, have the ability to control the flow of electrical current. Passive electrical components, such as capacitors, inductors, resistors, and transformers, create a relationship between voltage and current necessary to perform electrical circuit functions.

Passive and active components are formed over the surface of the semiconductor wafer by a series of process steps including doping, deposition, photolithography, etching, and planarization. Doping introduces impurities into the semiconductor material by techniques such as ion implantation or thermal diffusion. The doping process modifies the electrical conductivity of semiconductor material in active devices, transforming the semiconductor material into an insulator, conductor, or dynamically changing the semiconductor material conductivity in response to an electric field or base current. Transistors contain regions of varying types and degrees of doping arranged as necessary to enable the transistor to promote or restrict the flow of electrical current upon the application of the electric field or base current.

Active and passive components are formed by layers of materials with different electrical properties. The layers can be formed by a variety of deposition techniques determined in part by the type of material being deposited. For example, thin film deposition may involve chemical vapor deposition (CVD), physical vapor deposition (PVD), electrolytic plating, and electroless plating processes. Each layer is generally patterned to form portions of active components, passive components, or electrical connections between components.

The layers can be patterned using photolithography, which involves the deposition of light sensitive material, e.g., photoresist, over the layer to be patterned. A pattern is transferred from a photomask to the photoresist using light. The portion of the photoresist pattern subjected to light is removed using a solvent, exposing portions of the underlying layer to be patterned. The remainder of the photoresist is removed, leaving behind a patterned layer. Alternatively, some types of materials are patterned by directly depositing the material into the areas or voids formed by a previous deposition/etch process using techniques such as electroless and electrolytic plating.

Depositing a thin film of material over an existing pattern can exaggerate the underlying pattern and create a non-uniformly flat surface. A uniformly flat surface is required to produce smaller and more densely packed active and passive components. Planarization can be used to remove material from the surface of the wafer and produce a uniformly flat surface. Planarization involves polishing the surface of the wafer with a polishing pad. An abrasive material and corrosive chemical are added to the surface of the wafer during polishing. The combined mechanical action of the abrasive and corrosive action of the chemical removes any irregular topography, resulting in a uniformly flat surface.

Back-end manufacturing refers to cutting or singulating the finished wafer into the individual die and then packaging the die for structural support and environmental isolation. To singulate the die, the wafer is scored and broken along non-functional regions of the wafer called saw streets or scribes. The wafer is singulated using a laser cutting tool or saw blade. After singulation, the individual die are mounted to a package substrate that includes pins or contact pads for interconnection with other system components. Contact pads formed over the semiconductor die are then connected to contact pads within the package. The electrical connections can be made with solder bumps, stud bumps, conductive paste, or wirebonds. An encapsulant or other molding material is deposited over the package to provide physical support and electrical isolation. The finished package is then inserted into an electrical system and the functionality of the semiconductor device is made available to the other system components.

FIG. 1 illustrates electronic device 50 having a chip carrier substrate or printed circuit board (PCB) 52 with a plurality of semiconductor packages mounted on its surface. Electronic device 50 may have one type of semiconductor package, or multiple types of semiconductor packages, depending on the application. The different types of semiconductor packages are shown in FIG. 1 for purposes of illustration.

Electronic device 50 may be a stand-alone system that uses the semiconductor packages to perform one or more electrical functions. Alternatively, electronic device 50 may be a subcomponent of a larger system. For example, electronic device 50 may be part of a cellular phone, personal digital assistant (PDA), digital video camera (DVC), or other electronic communication device. Alternatively, electronic device 50 can be a graphics card, network interface card, or other signal processing card that can be inserted into a computer. The semiconductor package can include microprocessors, memories, application specific integrated circuits (ASIC), logic circuits, analog circuits, RF circuits, discrete devices, or other semiconductor die or electrical components. The miniaturization and the weight reduction are essential for these products to be accepted by the market. The distance between semiconductor devices must be decreased to achieve higher density.

In FIG. 1, PCB 52 provides a general substrate for structural support and electrical interconnect of the semiconductor packages mounted on the PCB. Conductive signal traces 54 are formed over a surface or within layers of PCB 52 using evaporation, electrolytic plating, electroless plating, screen printing, or other suitable metal deposition process. Signal traces 54 provide for electrical communication between each of the semiconductor packages, mounted components, and other external system components. Traces 54 also provide power and ground connections to each of the semiconductor packages.

In some embodiments, a semiconductor device has two packaging levels. First level packaging is a technique for mechanically and electrically attaching the semiconductor die to an intermediate carrier. Second level packaging involves mechanically and electrically attaching the intermediate carrier to the PCB. In other embodiments, a semiconductor device may only have the first level packaging where the die is mechanically and electrically mounted directly to the PCB.

For the purpose of illustration, several types of first level packaging, including wire bond package 56 and flip chip 58, are shown on PCB 52. Additionally, several types of second level packaging, including ball grid array (BGA) 60, bump chip carrier (BCC) 62, dual in-line package (DIP) 64, land grid array (LGA) 66, multi-chip module (MCM) 68, quad flat non-leaded package (QFN) 70, and quad flat package 72, are shown mounted on PCB 52. Depending upon the system requirements, any combination of semiconductor packages, configured with any combination of first and second level packaging styles, as well as other electronic components, can be connected to PCB 52. In some embodiments, electronic device 50 includes a single attached semiconductor package, while other embodiments call for multiple interconnected packages. By combining one or more semiconductor packages over a single substrate, manufacturers can incorporate pre-made components into electronic devices and systems. Because the semiconductor packages include sophisticated functionality, electronic devices can be manufactured using cheaper components and a streamlined manufacturing process. The resulting devices are less likely to fail and less expensive to manufacture resulting in a lower cost for consumers.

Figure 2A:
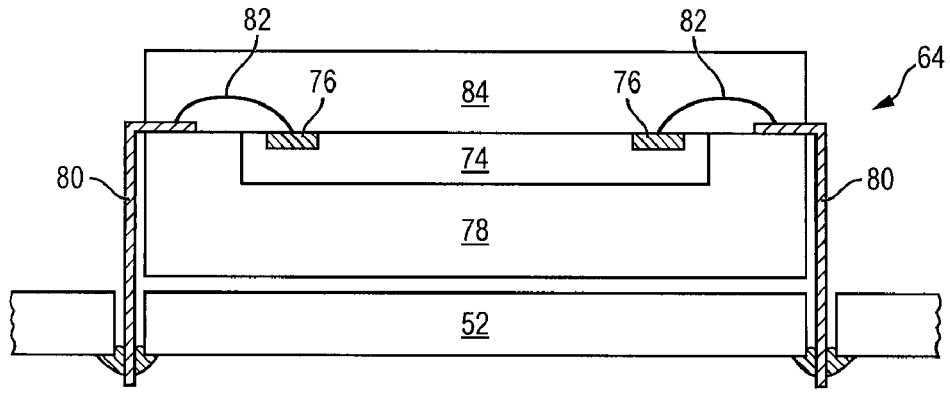
FIGS. 2a-2c illustrate further detail of the representative semiconductor packages mounted to the PCB.
Figure 2B:
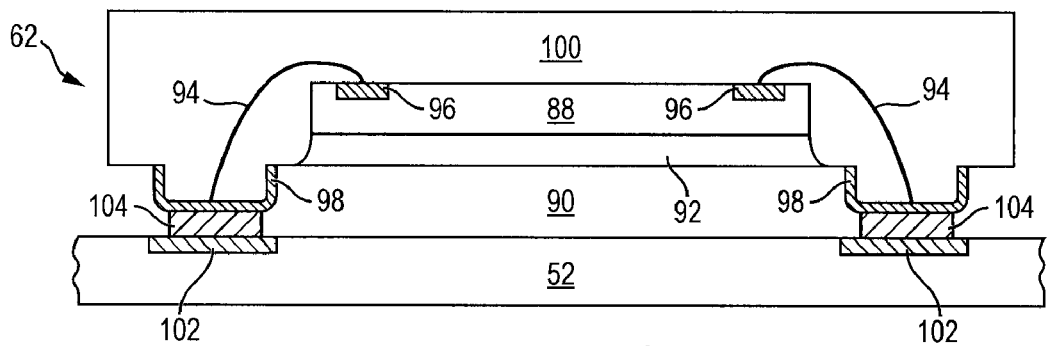
Figure 2C:
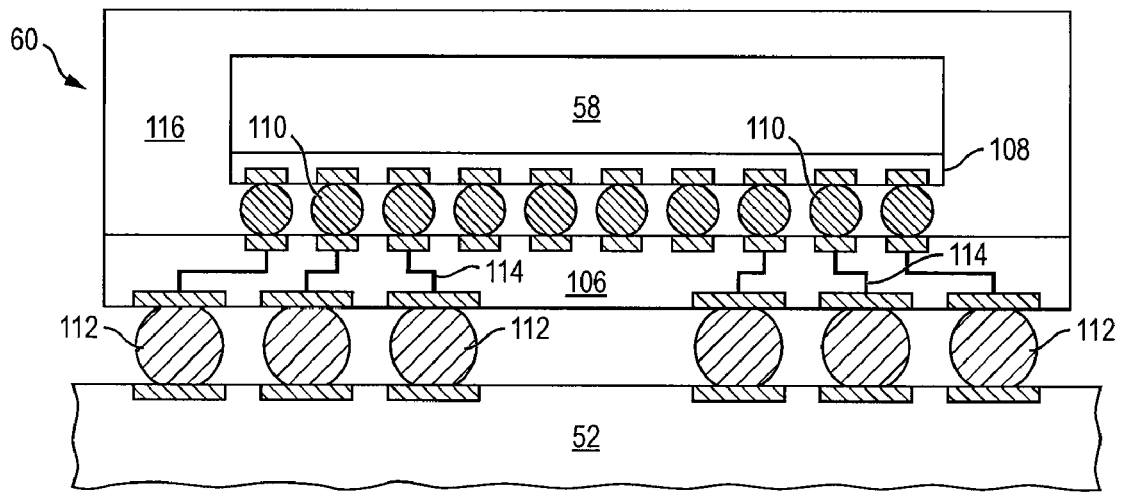

FIGS. 2a-2c show exemplary semiconductor packages. FIG. 2a illustrates further detail of DIP 64 mounted on PCB 52. Semiconductor die 74 includes an active region containing analog or digital circuits implemented as active devices, passive devices, conductive layers, and dielectric layers formed within the die and are electrically interconnected according to the electrical design of the die. For example, the circuit may include one or more transistors, diodes, inductors, capacitors, resistors, and other circuit elements formed within the active region of semiconductor die 74. Contact pads 76 are one or more layers of conductive material, such as aluminum (Al), copper (Cu), tin (Sn), nickel (Ni), gold (Au), or silver (Ag), and are electrically connected to the circuit elements formed within semiconductor die 74. During assembly of DIP 64, semiconductor die 74 is mounted to an intermediate carrier 78 using a gold-silicon eutectic layer or adhesive material such as thermal epoxy or epoxy resin. The package body includes an insulative packaging material such as polymer or ceramic. Conductor leads 80 and wire bonds 82 provide electrical interconnect between semiconductor die 74 and PCB 52. Encapsulant 84 is deposited over the package for environmental protection by preventing moisture and particles from entering the package and contaminating die 74 or wire bonds 82.

FIG. 2b illustrates further detail of BCC 62 mounted on PCB 52. Semiconductor die 88 is mounted over carrier 90 using an underfill or epoxy-resin adhesive material 92. Wire bonds 94 provide first level packaging interconnect between contact pads 96 and 98. Molding compound or encapsulant 100 is deposited over semiconductor die 88 and wire bonds 94 to provide physical support and electrical isolation for the device. Contact pads 102 are formed over a surface of PCB 52 using a suitable metal deposition process such as electrolytic plating or electroless plating to prevent oxidation. Contact pads 102 are electrically connected to one or more conductive signal traces 54 in PCB 52. Bumps 104 are formed between contact pads 98 of BCC 62 and contact pads 102 of PCB 52.

In FIG. 2c, semiconductor die 58 is mounted face down to intermediate carrier 106 with a flip chip style first level packaging. Active region 108 of semiconductor die 58 contains analog or digital circuits implemented as active devices, passive devices, conductive layers, and dielectric layers formed according to the electrical design of the die. For example, the circuit may include one or more transistors, diodes, inductors, capacitors, resistors, and other circuit elements within active region 108. Semiconductor die 58 is electrically and mechanically connected to carrier 106 through bumps 110.

BGA 60 is electrically and mechanically connected to PCB 52 with a BGA style second level packaging using bumps 112. Semiconductor die 58 is electrically connected to conductive signal traces 54 in PCB 52 through bumps 110, signal lines 114, and bumps 112. A molding compound or encapsulant 116 is deposited over semiconductor die 58 and carrier 106 to provide physical support and electrical isolation for the device. The flip chip semiconductor device provides a short electrical conduction path from the active devices on semiconductor die 58 to conduction tracks on PCB 52 in order to reduce signal propagation distance, lower capacitance, and improve overall circuit performance. In another embodiment, the semiconductor die 58 can be mechanically and electrically connected directly to PCB 52 using flip chip style first level packaging without intermediate carrier 106.

Figure 3A:
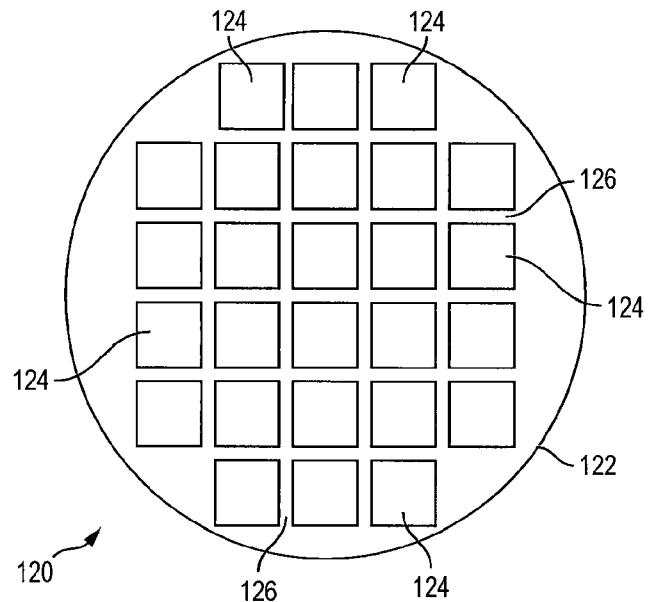
FIGS. 3a-3h illustrate a process of forming a dam material with a plurality of openings around a semiconductor die.

FIG. 3a shows a semiconductor wafer 120 with a base substrate material 122, such as silicon, germanium, gallium arsenide, indium phosphide, or silicon carbide, for structural support. A plurality of semiconductor die or components 124 is formed on wafer 120 separated by saw streets 126, as described above.

Figure 3B:
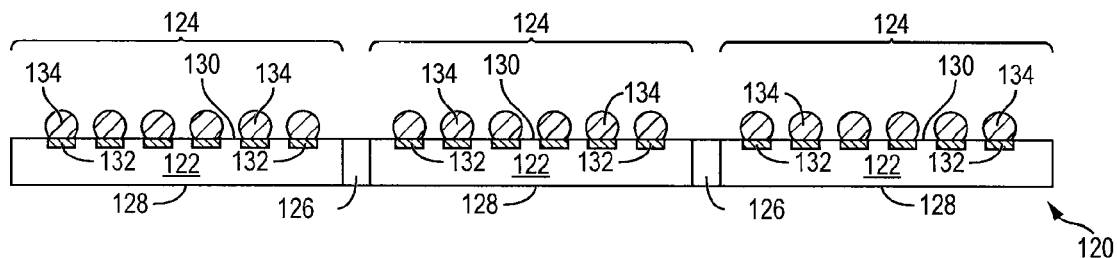

FIG. 3b shows a cross-sectional view of a portion of semiconductor wafer 120. Each semiconductor die 124 has a back surface 128 and an active surface 130 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 130 to implement analog circuits or digital circuits, such as digital signal processor (DSP), ASIC, memory, or other signal processing circuit. Semiconductor die 124 may also contain integrated passive devices (IPDs), such as inductors, capacitors, and resistors, for RF signal processing.

An electrically conductive layer 132 is formed over active surface 130 using PVD, CVD, electrolytic plating, electroless plating process, or other suitable metal deposition process. Conductive layer 132 can be one or more layers of Al, Cu, Sn, Ni, Au, Ag, or other suitable electrically conductive material. Conductive layer 132 operates as contact pads electrically connected to the circuits on active surface 130. Bumps 134 are formed on contact pads 132. In one embodiment, semiconductor die 124 is a flipchip type semiconductor die.

Figure 3C:
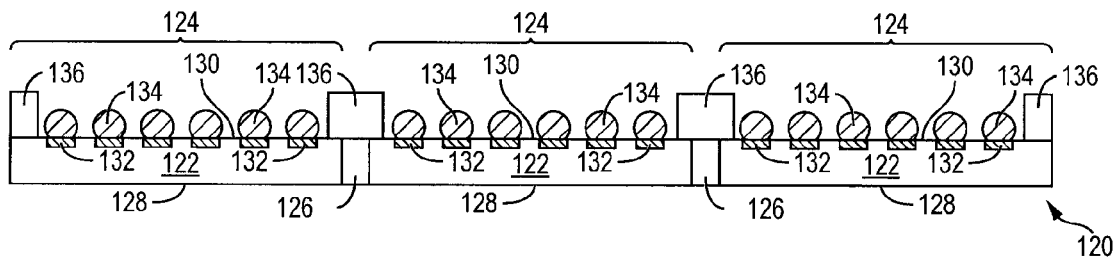

In FIG. 3c, a dam material 136 is deposited over an area of semiconductor wafer 120 designated as saw streets 126. Dam material 136 is also deposited around a periphery of semiconductor wafer 120. Dam material 136 can be a polymer, compliant material, b-stage material, adhesive, or metallic layer. In one embodiment, dam material 136 is silicone. The thickness of dam material 136 is substantially the same or slightly less than as the height of bumps 134 for a tight seal after mounting the semiconductor die to a substrate. Dam material 136 is formed by screen printing, dispensing, plating, or other suitable deposition process depending on the material. Accordingly, dam material 136 is formed around each semiconductor die 124, as shown in the plan view of FIG. 3d. A plurality of openings 138 is formed in dam material 136 by removing a portion of the dam material by laser ablation or etching. In case where dam material is a photosensitive material, openings 138 can be formed by exposure to light followed by development. The openings 138 are cut linearly through two sides of dam material 136 for each semiconductor die 124. The dam material 136 around each semiconductor die 124 has at least two openings 138: one for inlet and one for outlet of mold underfill material, as described below. The openings 138 are typically formed during the same processing sequence as the formation of dam material 136.

Figure 3D:
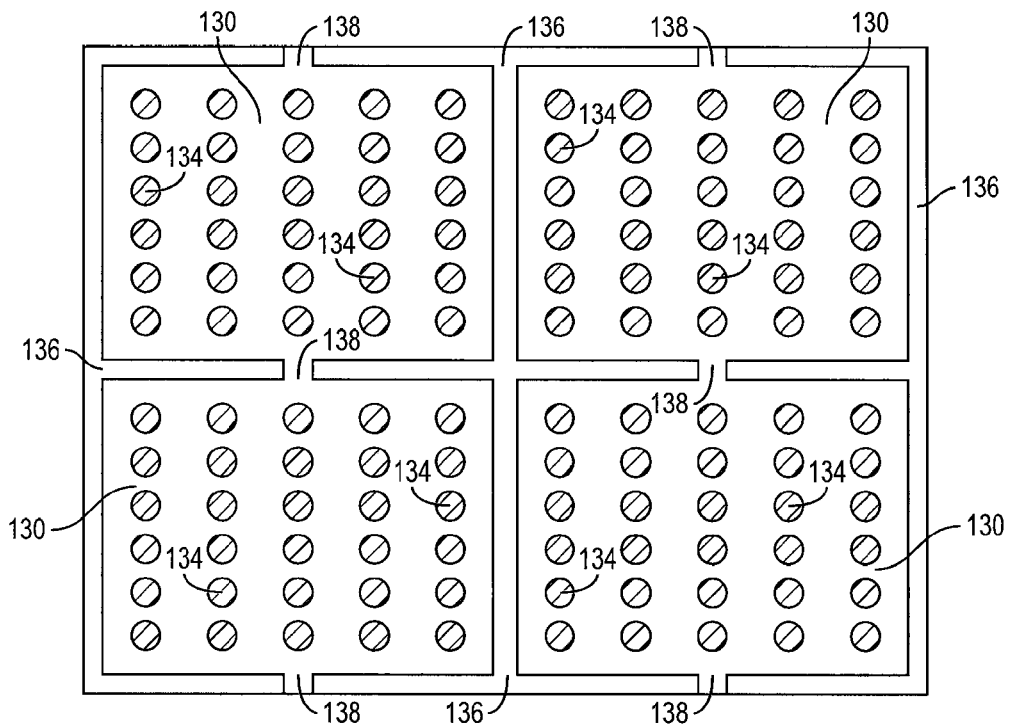
Figure 3E:
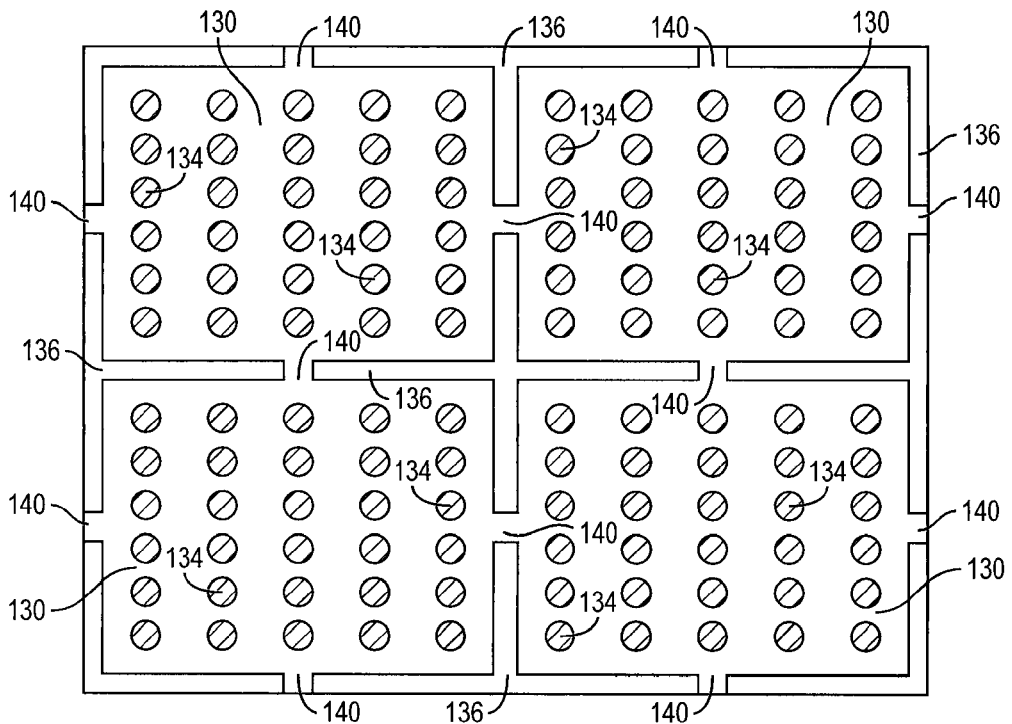
Figure 3F:
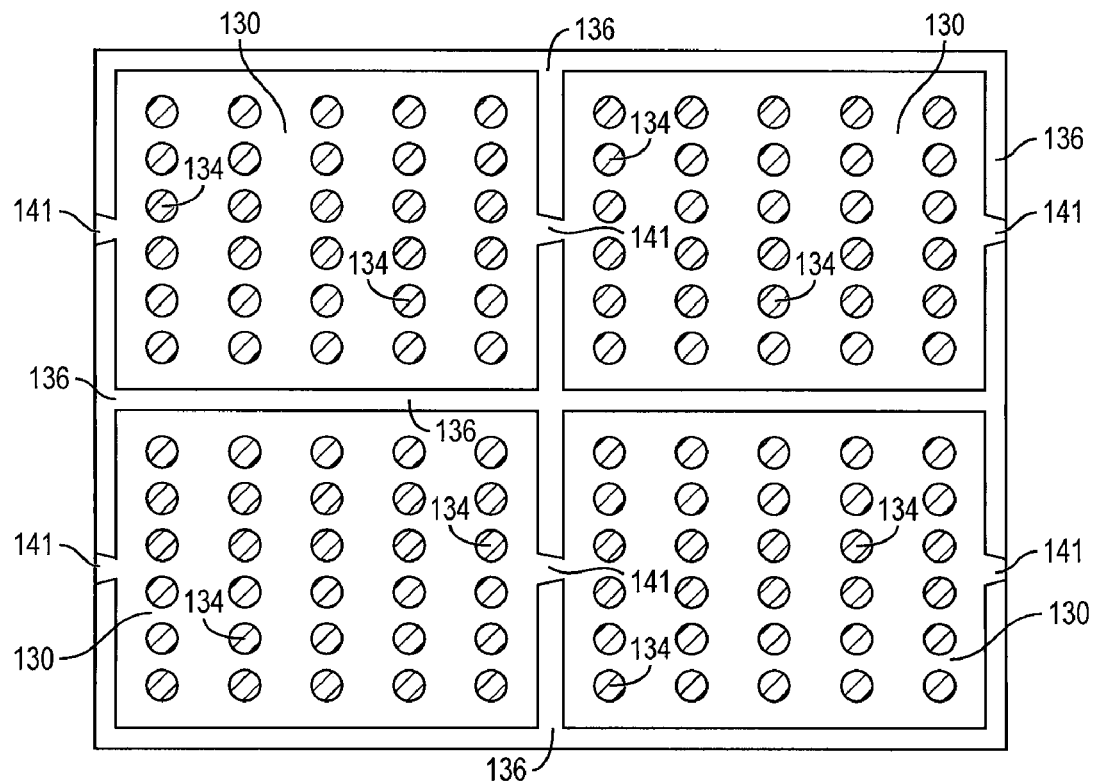
Figure 3G:
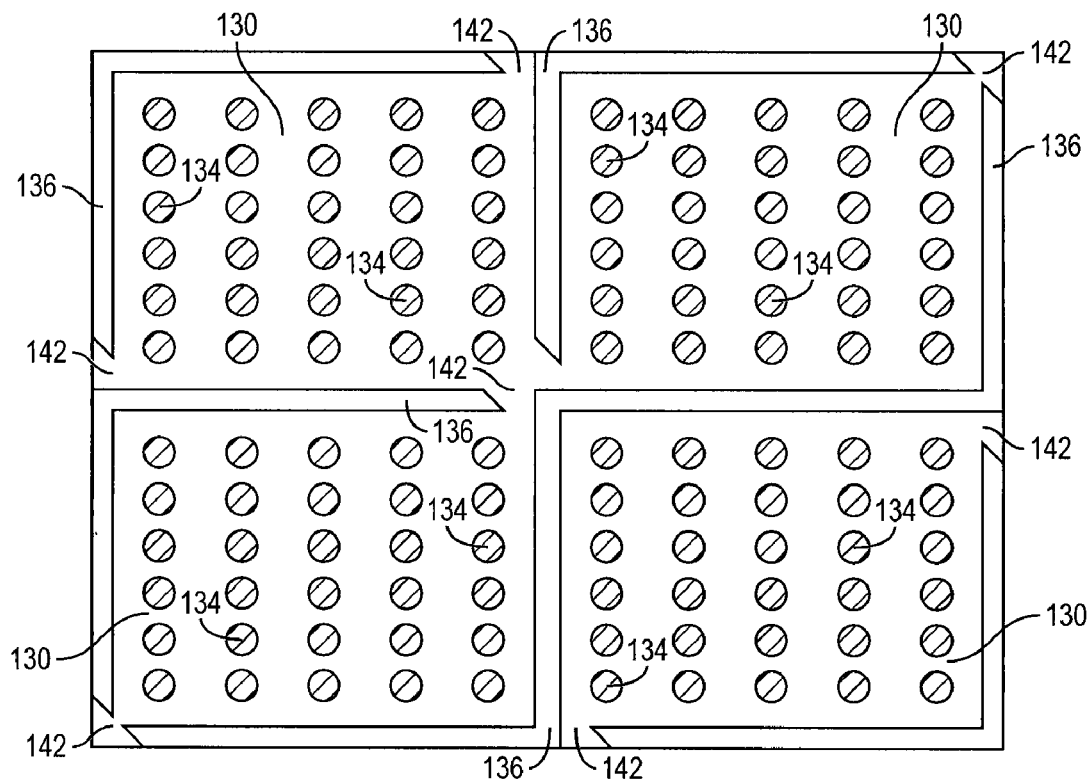

FIG. 3e shows a plan view of another configuration of openings 140 formed in dam material 136. In this case, openings 140 are cut into dam material 136 on each side semiconductor die 124 by laser ablation or etching. FIG. 3f shows a plan view of another configuration of openings 141 formed in dam material 136. In this case, openings 141 are cut trapezoidal or diagonal through a side of dam material 136 for each semiconductor die 124 by laser ablation or etching. FIG. 3g shows a plan view of another configuration of openings 142 formed in dam material 136. In this case, openings 142 are cut diagonally through corners of dam material 136 for each semiconductor die 124 by laser ablation or etching.

Figure 3H:
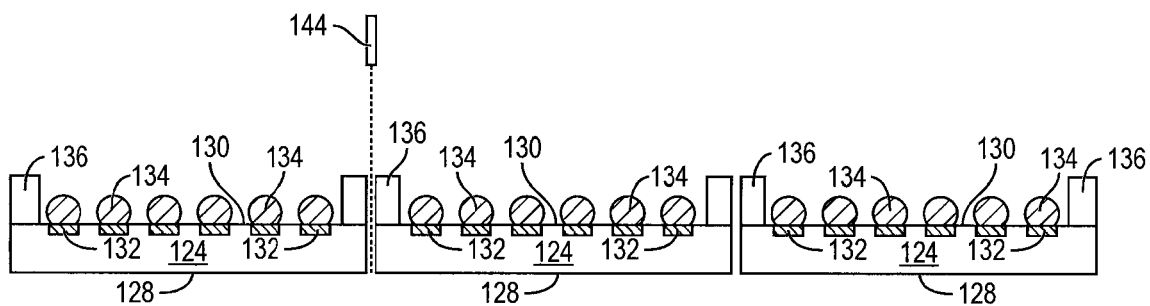

In FIG. 3h, semiconductor wafer 120 is singulated through saw street 126 using saw blade or laser cutting tool 144 into individual semiconductor die 124. The singulation cut is made through a longitudinal center of dam material 136. Accordingly, each semiconductor die 124 has bumps 134 formed over contact pads 132 and dam material 136 with openings 138 formed around a perimeter of the die.

Figure 4A:
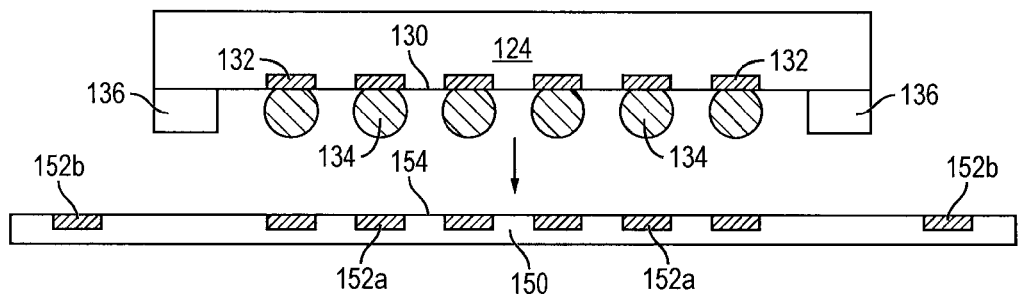
FIGS. 4a-4k illustrate a mold underfill of a semiconductor die using a dispenser and vacuum assist.

FIGS. 4a-4k illustrate, in relation to FIGS. 1 and 2a-2c, a mold underfill of a semiconductor die using a dispenser and vacuum assist. FIG. 4a shows a substrate or PCB 150 contains a base material such as silicon, polymer, laminate, or other suitable rigid material for structural support. A plurality of contact pads 152 with electrical trace lines is formed on surface 154 of substrate 150. FIG. 4a shows a portion of substrate 150 associated with one semiconductor die. Substrate 150 extends beyond the dimensions shown in FIG. 4a for a wafer-level multi-die attachment.

Figure 4B:
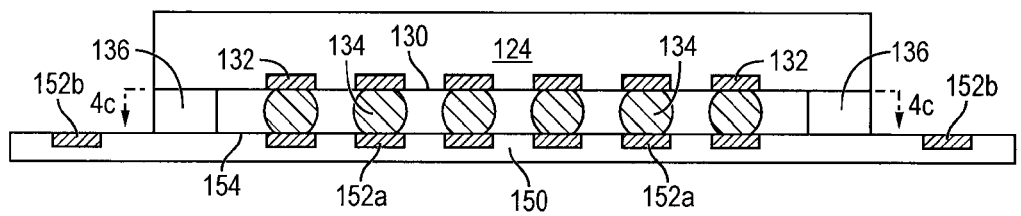
Figure 4C:
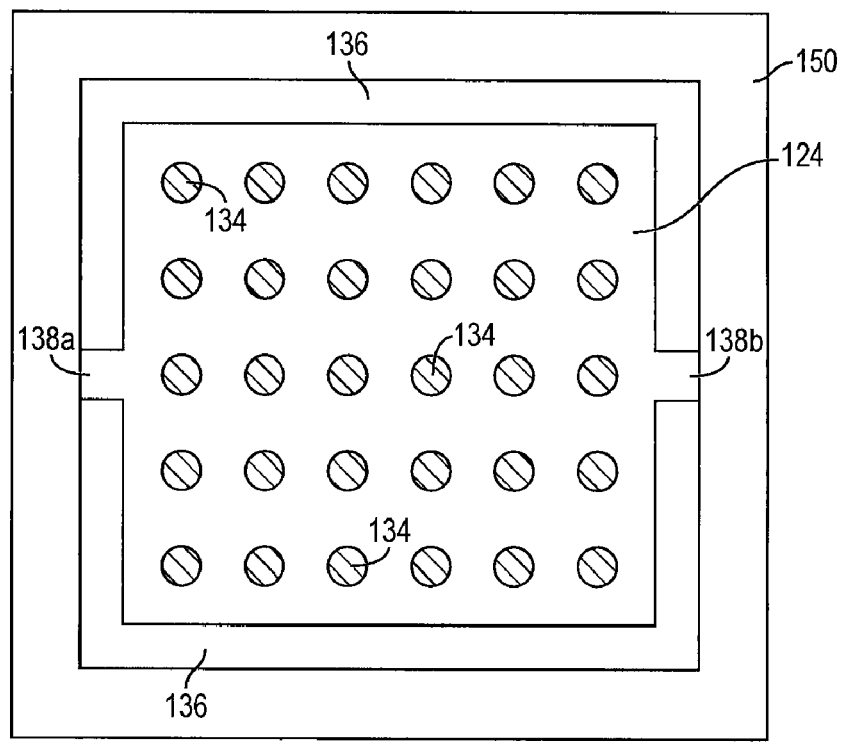

A semiconductor die 124 from FIGS. 3a-3h is positioned over and mounted to contact pads 152a using a pick and place operation. Bumps 134 are metallurgically and electrically connected to contact pads 152a by temperature reflow and/or thermal compression bonding, as shown in FIG. 4b. Any flux residue or vapor can be removed or exhausted through openings 138. Flux is typically not necessary if substrate comes with organic solderability preservatives (OSP) finish. FIG. 4c shows a plan view of semiconductor die 124 and dam material 136 with openings 138 mounted to substrate 150 in accordance with FIG. 3d. In other embodiments, semiconductor die 124 is surrounded by dam material 136 with openings 140-142, as described in FIGS. 3e-3g.

Figure 4D:
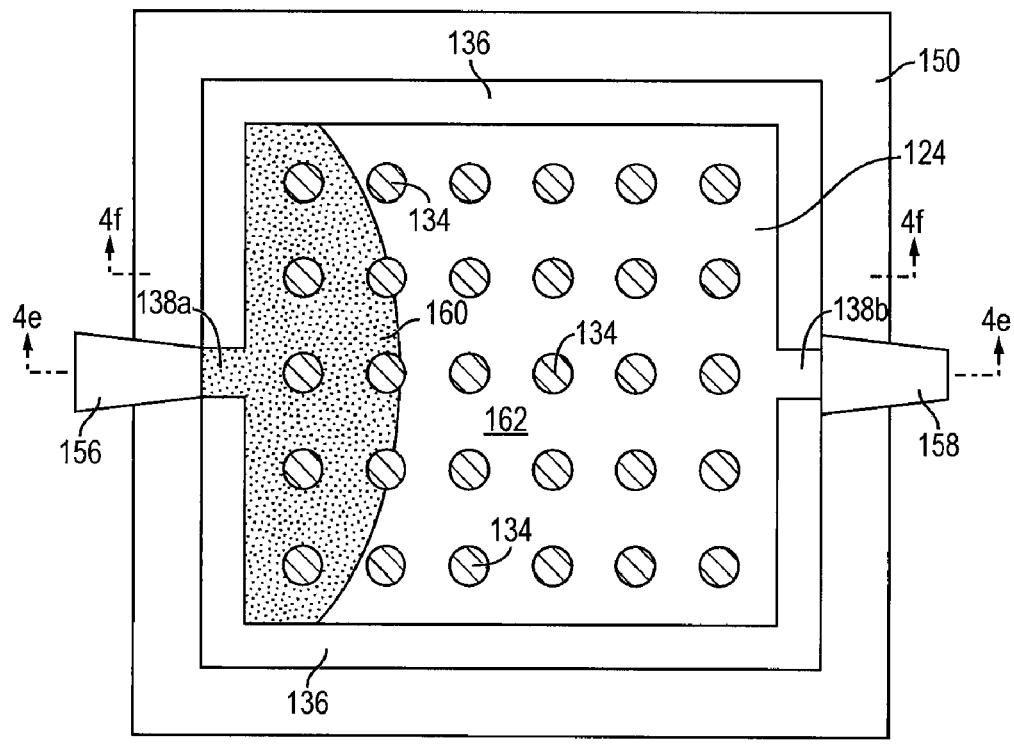
Figure 4E:
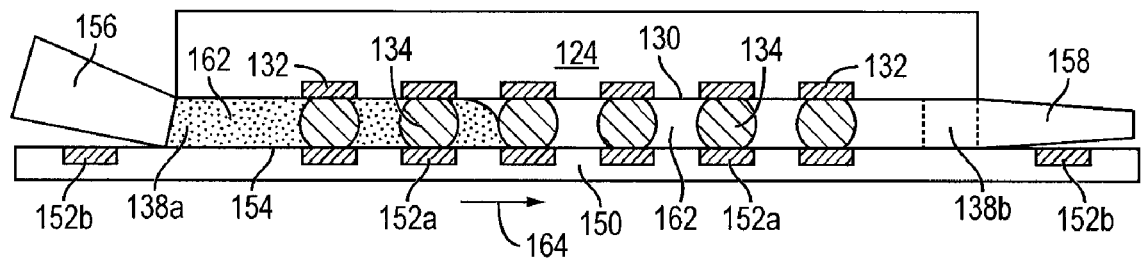

In FIG. 4d, an underfill dispenser 156 is placed in fluid communication with inlet opening 138a, on one side of dam material 136. A vacuum 158 is placed in fluid communication with outlet opening 138b, on an opposite side of dam material 136. A mold underfill (MUF) or encapsulant material 160 is injected under pressure from dispenser 156 into area 162 between semiconductor die 124 and substrate 150 around bumps 134, as shown in the cross-sectional view of FIG. 4e. MUF 160 can be polymer composite material, such as epoxy resin with filler, epoxy acrylate with filler, or polymer with proper filler. MUF 160 is non-conductive and environmentally protects the semiconductor device from external elements and contaminants. Dispenser 156 pushes MUF 160 into area 162 under pressure while vacuum 158 draws the MUF in the direction of arrow 164 for a complete and uniform coverage through area 162 without forming voids. The combination of underfill dispensing under pressure with vacuum draw through the inlet and outlet(s) of dam material 136 controls the flow or spread of MUF 160 and reduces thermal stress on semiconductor die 124 and substrate 150. In general, the flow of MUF 160 is given by $(3 \mu L^2)/(h \gamma \cos \theta)$, where L is flow distance, $\mu$ is underfill viscosity, h is vertical separation, $\gamma$ is surface tension, and $\theta$ is wetting angle. Consequently, MUF 160 can be used with a wide range of viscosities, given the ability to control flow or spreading and thermal stress on semiconductor die 124.

Figure 4F:
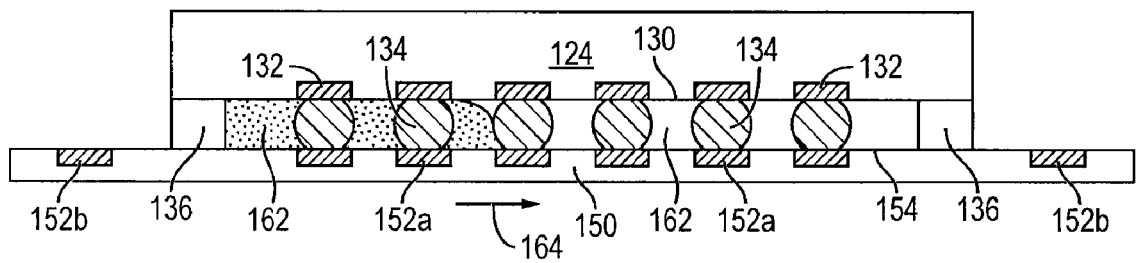

FIG. 4f shows another cross-sectional view, taken along line 4f-4f in FIG. 4d, of MUF 160 being injected into area 162. Dam material 136 blocks any bleed-out or spreading of MUF 160 to unintended areas, such as contact pads 152b of substrate 150. Dam material 136 also reduces risk of collapse of bumps 134. Dam material 136 in a flipchip arrangement reduces die shift during temperature reflow due to the bonding between the dam material and substrate, particularly for thin die.

Figure 4G:
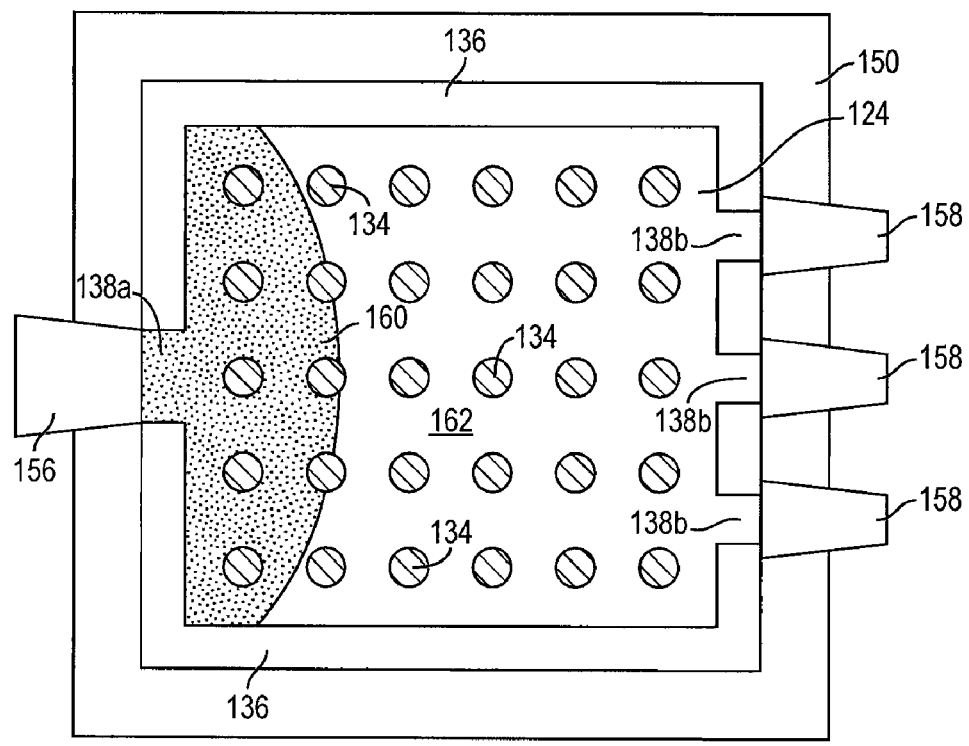

FIG. 4g shows another embodiment in accordance with FIG. 3d with multiple openings 138b. An underfill dispenser 156 placed in fluid communication with inlet opening 138a, on one side of dam material 136, and vacuum 158 placed in fluid communication with a plurality of outlet openings 138b, on an opposite side of the dam material. In this case, inlet opening 138a is made larger than outlet openings 138b to equalize the pressure and increase underfill dispensing rate. A MUF or encapsulant material 160 is injected under pressure from dispenser 156 into area 162 between semiconductor die 124 and substrate 150 around bumps 134. Dispenser 156 pushes MUF 160 into area 162 under pressure while vacuum 158 draws the MUF for a complete and uniform coverage through area 162 without forming voids. Dam material 136 blocks any bleed-out or spreading of MUF 160 to unintended areas, such as contact pads 152b of substrate 150.

Figure 4H:
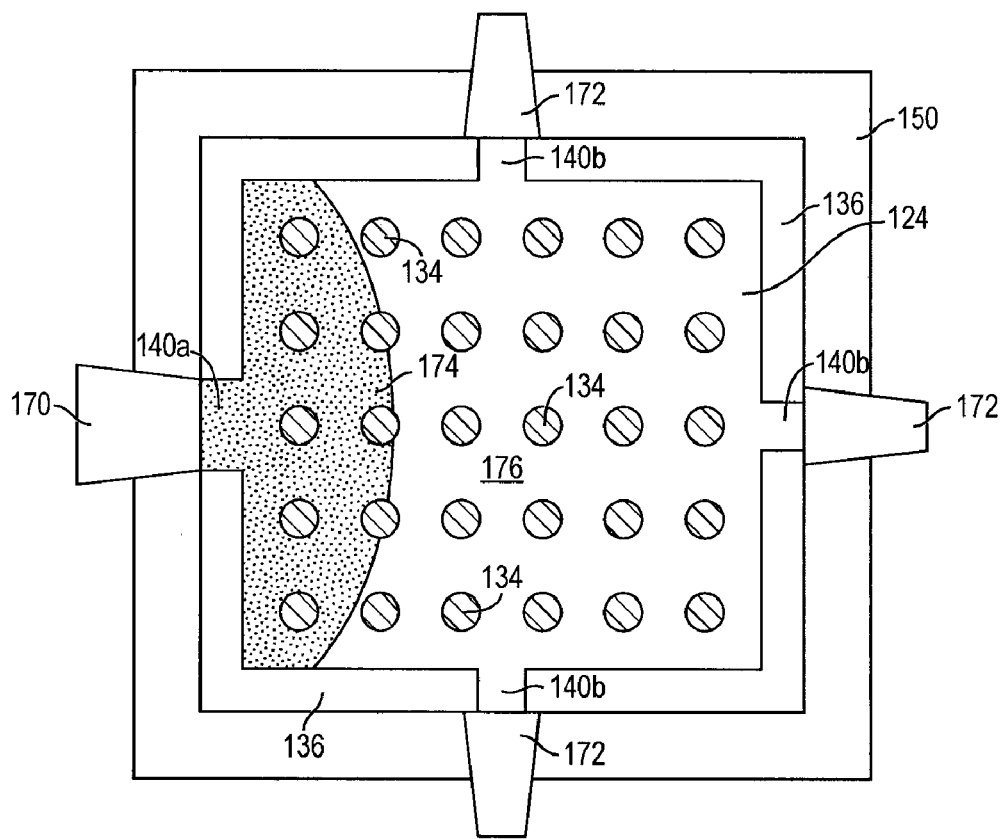

FIG. 4h shows an embodiment in accordance with FIG. 3e with underfill dispenser 170 placed in fluid communication with inlet opening 140a, on one side of dam material 136, and vacuum 172 placed in fluid communication with outlet openings 140b, on three other sides of the dam material. In this case, inlet opening 140a is made larger than outlet openings 140b to equalize the pressure and increase underfill dispensing rate. Alternatively, two openings 140 can be used as inlets and two openings 140 can be used as outlets. A MUF or encapsulant material 174 is injected under pressure from dispenser 170 into area 176 between semiconductor die 124 and substrate 150 around bumps 134. Dispenser 170 pushes MUF 174 into area 176 under pressure while vacuum 172 draws the MUF for a complete and uniform coverage through area 176 without forming voids. Dam material 136 blocks any bleed-out or spreading of MUF 174 to unintended areas, such as contact pads 152b of substrate 150.

Figure 4I:
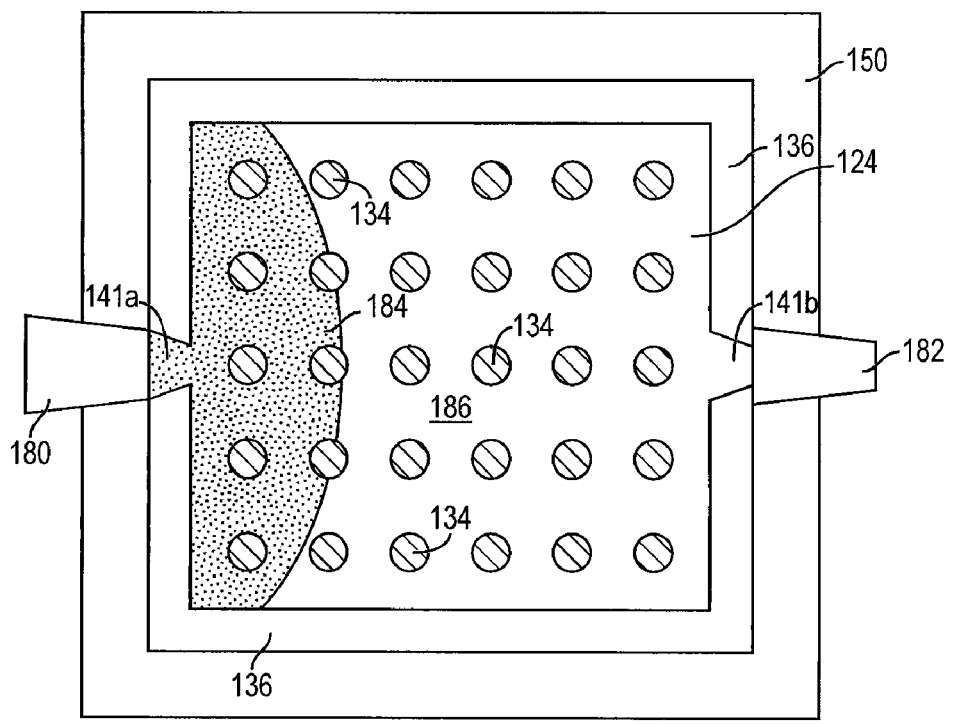

FIG. 4i shows an embodiment in accordance with FIG. 3f with underfill dispenser 180 placed in fluid communication with inlet trapezoidal opening 141a, on one side of dam material 136, and vacuum 182 placed in fluid communication with trapezoidal outlet opening 141b, on an opposite side of the dam material. A MUF or encapsulant material 184 is injected under pressure from dispenser 180 into area 186 between semiconductor die 124 and substrate 150 around bumps 134. Dispenser 180 pushes MUF 184 into area 186 under pressure while vacuum 182 draws the MUF for a complete and uniform coverage through area 186 without forming voids. Dam material 136 blocks any bleed-out or spreading of MUF 184 to unintended areas, such as contact pads 152b of substrate 150.

Figure 4J:
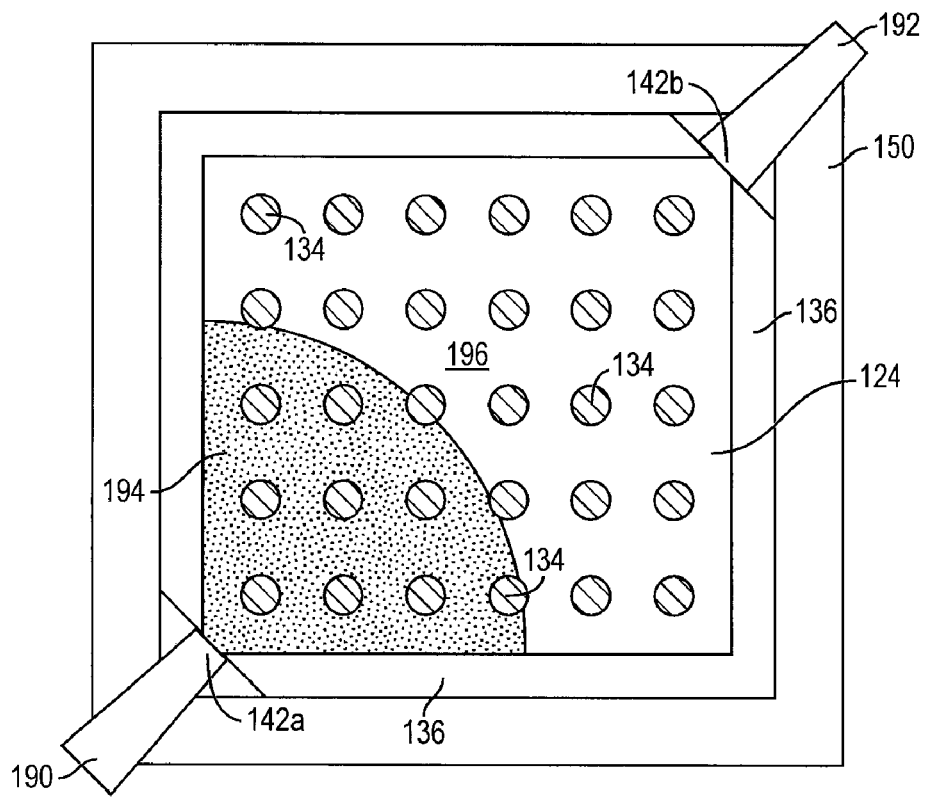

FIG. 4j shows an embodiment in accordance with FIG. 3g with underfill dispenser 190 placed in fluid communication with inlet opening 142a, on one corner of dam material 136, and vacuum 192 placed in fluid communication with outlet opening 142b, on an opposite corner of the dam material. A MUF or encapsulant material 194 is injected under pressure from dispenser 190 into area 196 between semiconductor die 124 and substrate 150 around bumps 134. Dispenser 190 pushes MUF 194 into area 196 under pressure while vacuum 192 draws the MUF for a complete and uniform coverage through area 196 without forming voids. Dam material 136 blocks any bleed-out or spreading of MUF 194 to unintended areas, such as contact pads 152b of substrate 150. The MUF is cured.

Figure 4K:
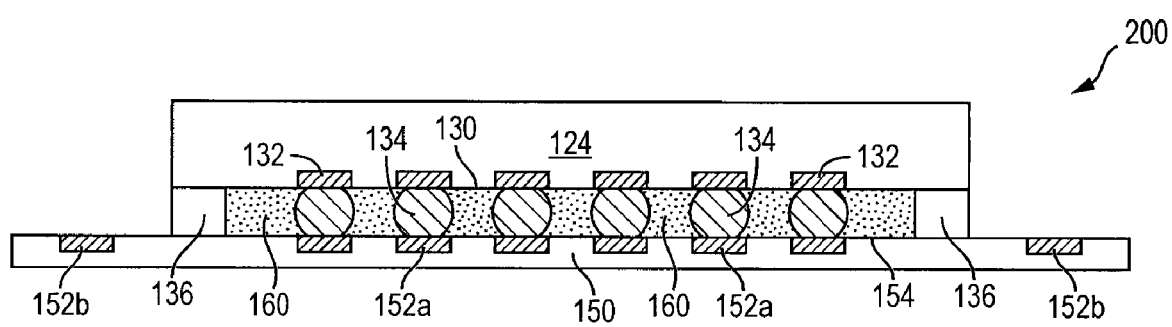

Substrate 150 is singulated through MUF 160 with saw blade or laser cutting tool. FIG. 4k shows flipchip package 200 after MUF and singulation. Semiconductor die 124 is electrically connected through contact pads 132 and bumps 134 to substrate 150. MUF 160 is completely and uniformly deposited between semiconductor die 124 and substrate 150 and around bumps 134. The MUF reduces formation of voids and is particularly useful for a complete and uniform MUF coverage of large semiconductor die, e.g., 45 by 45 mm or larger. The combination of underfill dispensing under pressure with vacuum draw through inlet(s) and outlet(s) of dam material 136 controls the flow or spread of MUF 160 and reduces thermal stress on semiconductor die 124 and substrate 150. The MUF is achieved in less time at a low cost. In addition, a MUF with a wide range of viscosities can be used given the ability to control spreading and thermal stress on semiconductor die 124. Dam material 136 blocks any bleed-out or spreading of MUF 160 to unintended areas, such as contact pads 152b. Dam material 136 also reduces risk of collapse of bumps 134.

Figure 5:
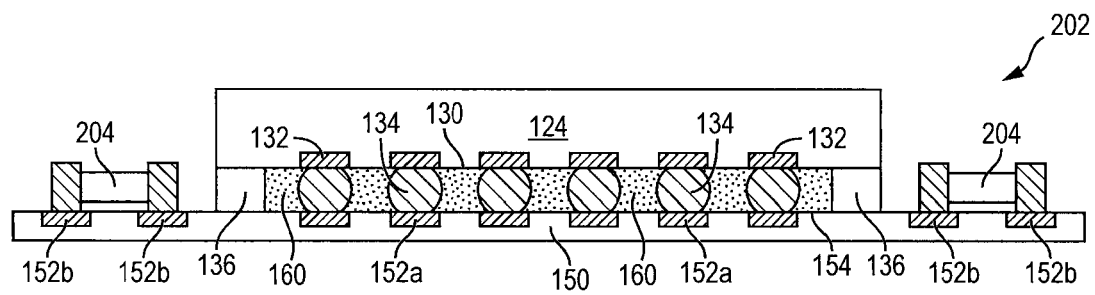
FIG. 5 illustrates a flipchip package with discrete semiconductor components surface mounted to the substrate.

FIG. 5 shows an embodiment of flipchip package 202, similar to FIG. 4k, with discrete semiconductor components 204 mounted to contact pads 152b using surface mount technology. Examples of discrete semiconductor components 204 include inductors, capacitors, resistors, transistors, diodes, and other active and passive devices.

Figure 6:
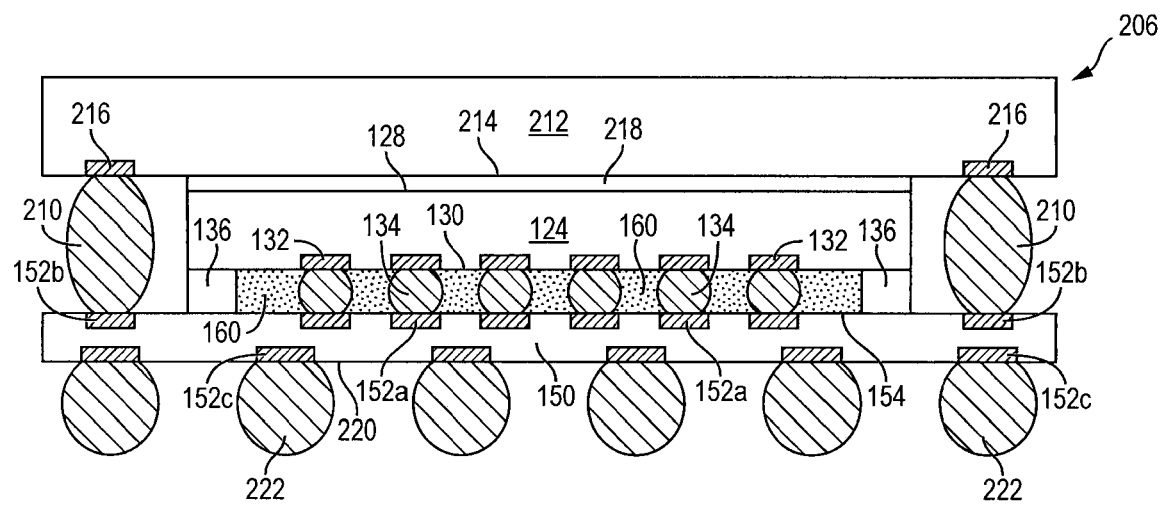
FIG. 6 illustrates an upper semiconductor die mounted to the flipchip package.

FIG. 6 shows an embodiment of flipchip package 206, similar to FIG. 4k, with bumps 210 formed over contact pads 152b. A semiconductor die 212 has an active surface 214 containing analog or digital circuits implemented as active devices, passive devices, conductive layers, and dielectric layers formed within the die and electrically interconnected according to the electrical design and function of the die. For example, the circuit may include one or more transistors, diodes, and other circuit elements formed within active surface 214 to implement analog circuits or digital circuits, such as DSP, ASIC, memory, or other signal processing circuit. Semiconductor die 212 may also contain IPDs, such as inductors, capacitors, and resistors, for RF signal processing. In one embodiment, semiconductor die 212 is a flipchip type semiconductor die. Contact pads 216 are formed on active surface 214 and electrically connected to the circuits on the active surface. Semiconductor die 212 is a tested known good unit (KGU). Semiconductor die 212 is mounted to bumps 210 with a b-stage coating 218 formed between back surface 128 of semiconductor die 124 and active surface 214 of semiconductor die 212. Semiconductor die 124 and 212 can be implemented as system-in-package (SiP) or package-on-package (PoP) arrangements.

An electrically conductive bump material is deposited over contact pads 152c formed on surface 220 of substrate 150 using an evaporation, electrolytic plating, electroless plating, ball drop, or screen printing process. The bump material can be Al, Sn, Ni, Au, Ag, Pb, Bi, Cu, solder, and combinations thereof, with an optional flux solution. For example, the bump material can be eutectic Sn/Pb, high-lead solder, or lead-free solder. The bump material is bonded to contact pads 152c using a suitable attachment or bonding process. In one embodiment, the bump material is reflowed by heating the material above its melting point to form spherical balls or bumps 222. In some applications, bumps 222 are reflowed a second time to improve electrical contact to contact pads 152c. An under bump metallization (UBM) can be formed under bumps 222. The bumps can also be compression bonded to contact pads 152c. Bumps 222 represent one type of interconnect structure that can be formed over contact pads 152c. The interconnect structure can also use stud bump, micro bump, or other electrical interconnect.

While one or more embodiments of the present invention have been illustrated in detail, the skilled artisan will appreciate that modifications and adaptations to those embodiments may be made without departing from the scope of the present invention as set forth in the following claims.

What is claimed:

1. A method of making a semiconductor device, comprising:
    providing a semiconductor wafer containing a plurality of first semiconductor die separated by saw streets;
    forming a dam material over the saw streets around each of the first semiconductor die;
    forming a plurality of openings in the dam material;
    singulating the semiconductor wafer along the saw streets through the dam material to separate the first semiconductor die;
    mounting the first semiconductor die to a substrate;
    depositing a mold underfill through a first opening in the dam material; and
    drawing a vacuum on a second opening in the dam material to cause the underfill material to cover an area between the first semiconductor die and substrate.

2. The method of claim 1, further including disposing a dispenser in fluid communication with the first opening of the dam material to deposit the underfill material.

3. The method of claim 1, further including disposing a vacuum in fluid communication with the second opening of the dam material to draw the underfill material through the area between the first semiconductor die and substrate.

4. The method of claim 1, further including forming the openings in the dam material on each side of the first semiconductor die.

5. The method of claim 1, further including mounting a discrete semiconductor component over the substrate.

6. The method of claim 1, further including mounting a second semiconductor die over the first semiconductor die.

7. A method of making a semiconductor device, comprising:
   providing a semiconductor wafer containing a plurality of semiconductor die;
   forming a dam material over the semiconductor wafer around each of the semiconductor die;
   forming a plurality of openings in the dam material;
   singulating the semiconductor wafer to separate the semiconductor die after forming the dam material over the semiconductor wafer;
   disposing the semiconductor die over a substrate;
   depositing a mold underfill through a first opening in the dam material to cover an area between the semiconductor die and substrate.

8. The method of claim 7, further including disposing a dispenser in fluid communication with the first opening of the dam material to deposit the underfill material.

9. The method of claim 7, wherein the underfill material covers the area between the semiconductor die and substrate without voids.

10. The method of claim 7, further including forming the openings in the dam material on each side of the semiconductor die.

11. The method of claim 7, further including forming the openings in the dam material with a diagonal or trapezoidal shape.

12. The method of claim 7, further including drawing a vacuum on a second opening in the dam material to spread the underfill material over the area between the semiconductor die and substrate.

13. The method of claim 12, further including disposing a vacuum in fluid communication with the second opening of the dam material to draw the underfill material through the area between the semiconductor die and substrate.

14. The method of claim 12, wherein the first opening in the dam material is larger than the second opening in the dam material.

15. A method of making a semiconductor device, comprising:
   providing a semiconductor die;
   forming a dam material over a surface of and the semiconductor die;
   forming a plurality of openings in the dam material;
   disposing the semiconductor die including the dam material formed over the surface of the semiconductor die over a substrate; and
   depositing a mold underfill through a first opening in the dam material to cover an area between the semiconductor die and substrate.

16. The method of claim 15, further including disposing a dispenser in fluid communication with the first opening of the dam material to deposit the underfill material.

17. The method of claim 15, further including forming the openings in the dam material on each side of the semiconductor die.

18. The method of claim 15, further including forming the openings in the dam material on corners of the semiconductor die.

19. The method of claim 15, further including drawing a vacuum on a second opening in the dam material to spread the underfill material over the area between the semiconductor die and substrate.

20. The method of claim 19, further including disposing a vacuum in fluid communication with the second opening of the dam material to draw the underfill material through the area between the semiconductor die and substrate.

21. The method of claim 19, wherein a number of second openings in the dam material is greater than a number of first openings in the dam material.

22. The method of claim 19, wherein the first opening in the dam material is larger than the second opening in the dam material.

23. A semiconductor device, comprising:
   a substrate;
   a semiconductor die;
   a dam material formed over a surface of and the semiconductor die including a plurality of openings in the dam material, wherein the semiconductor die with the dam material formed over the surface of the semiconductor die is disposed over the substrate; and
   a dispenser in fluid communication with a first opening in the dam material for depositing a mold underfill through the first opening to cover an area between the semiconductor die and substrate.

24. The semiconductor device of claim 23, further including a vacuum in fluid communication with a second opening in the dam material for drawing the underfill material over the area between the semiconductor die and substrate.

25. The semiconductor device of claim 24, wherein a number of second openings in the dam material is greater than a number of first openings in the dam material.

26. The semiconductor device of claim 24, wherein the first opening in the dam material is larger than the second opening in the dam material.

27. The semiconductor device of claim 23, wherein the openings in the dam material are formed on each side of the semiconductor die.

28. The semiconductor device of claim 23, wherein the underfill material covers the area between the semiconductor die and substrate without voids.

* * * * *

UNITED STATES PATENT AND TRADEMARK OFFICE
CERTIFICATE OF CORRECTION

PATENT NO. : 8,399,305 B2
APPLICATION NO. : 12/885831
DATED : March 19, 2013
INVENTOR(S) : Rui Huang et al.

Page 1 of 1

It is certified that error appears in the above-identified patent and that said Letters Patent is hereby corrected as shown below:

In the Claims:

Column 11, Claim 15, Line 44, delete the word "and".

Column 12, Claim 23, Line 27, delete the word "and".

Signed and Sealed this
Fourteenth Day of May, 2013

Teresa Stanek Rea
*Acting Director of the United States Patent and Trademark Office*